(12) United States Patent
Phoa et al.

(10) Patent No.: US 10,903,372 B2
(45) Date of Patent: Jan. 26, 2021

(54) METAL-OXIDE-POLYSILICON TUNABLE RESISTOR FOR FLEXIBLE CIRCUIT DESIGN AND METHOD OF FABRICATING SAME

(71) Applicant: Intel Corporation, Santa Clara, CA (US)

(72) Inventors: Kinyip Phoa, Beaverton, OR (US); Jui-Yen Lin, Hillsboro, OR (US); Nidhi Nidhi, Hillsboro, OR (US); Chia-Hong Jan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 259 days.

(21) Appl. No.: 15/770,009

(22) PCT Filed: Dec. 11, 2015

(86) PCT No.: PCT/US2015/065217
§ 371 (c)(1),
(2) Date: Apr. 20, 2018

(87) PCT Pub. No.: WO2017/099792
PCT Pub. Date: Jun. 15, 2017

(65) Prior Publication Data
US 2020/0194599 A1    Jun. 18, 2020

(51) Int. Cl.
*H01L 29/8605* (2006.01)
*H01L 29/417* (2006.01)
*H01L 29/423* (2006.01)
*H01L 29/66* (2006.01)

(52) U.S. Cl.
CPC ........ *H01L 29/8605* (2013.01); *H01L 29/417* (2013.01); *H01L 29/423* (2013.01); *H01L 29/66166* (2013.01)

(58) Field of Classification Search
CPC .............. H01L 29/8605; H01L 29/423; H01L 29/66166; H01L 29/417; H01L 28/20; H01L 29/785
See application file for complete search history.

(56) References Cited

U.S. PATENT DOCUMENTS

| 2008/0001187 A1* | 1/2008 | Booth | H01L 29/66795 257/288 |
| 2009/0002120 A1* | 1/2009 | Molin | H01C 10/14 338/195 |
| 2009/0152679 A1* | 6/2009 | Harada | H01L 27/016 257/538 |

(Continued)

OTHER PUBLICATIONS

International Search Report and Written Opinion for International Patent Application No. PCT/US2015/065217 dated Aug. 18, 2016, 15 pgs.

(Continued)

*Primary Examiner* — Yasser A Abdelaziez
(74) *Attorney, Agent, or Firm* — Schwabe, Williamson & Wyatt, P.C.

(57) ABSTRACT

Metal-oxide-polysilicon tunable resistors and methods of fabricating metal-oxide-polysilicon tunable resistors are described. In an example, a tunable resistor includes a polysilicon resistor structure disposed above a substrate. A gate oxide layer is disposed on the polysilicon resistor structure. A metal gate layer is disposed on the gate oxide layer.

22 Claims, 18 Drawing Sheets

(56) References Cited

U.S. PATENT DOCUMENTS

| 2011/0163417 A1* | 7/2011 | Soss | H01L 28/20 |
| | | | 257/536 |
| 2012/0299115 A1* | 11/2012 | Chuang | H01L 21/31055 |
| | | | 257/379 |
| 2013/0099317 A1* | 4/2013 | Xia | H01L 29/785 |
| | | | 257/348 |
| 2013/0105942 A1 | 5/2013 | Chen et al. | |
| 2014/0084381 A1* | 3/2014 | Yeh | H01L 27/0629 |
| | | | 257/380 |
| 2016/0247917 A1* | 8/2016 | Kondo | H01L 29/7391 |

OTHER PUBLICATIONS

International Preliminary Report on Patentability for International Patent Application No. PCT/US2015/065217 dated Jun. 21, 2018, 12 pgs.

Office Action from Taiwan Patent Application No. 105136292 dated Apr. 14, 2020 20 pgs.

* cited by examiner

METAL-OXIDE-POLYSILICON TUNABLE RESISTOR FOR FLEXIBLE CIRCUIT DESIGN AND METHOD OF FABRICATING SAME

CROSS-REFERENCE TO RELATED APPLICATION

This patent application is a U.S. National Phase Application under 35 U.S.C. § 371 of International Application No. PCT/US2015/065217, filed Dec. 11, 2015, entitled "METAL-OXIDE-POLYSILICON TUNABLE RESISTOR FOR FLEXIBLE CIRCUIT DESIGN AND METHOD OF FABRICATING SAME," which designates the United States of America, the entire disclosure of which is hereby incorporated by reference in its entirety and for all purposes.

TECHNICAL FIELD

Embodiments of the invention are in the field of semiconductor devices and processing and, in particular, metal-oxide-polysilicon tunable resistors and methods of fabricating metal-oxide-polysilicon tunable resistors.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, high-k and metal gate processing has been introduced into front end of line (FEOL) processing schemes to enable further scaling. Additionally, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In other instances, silicon-on-insulator substrates are preferred because of the improved short-channel behavior of tri-gate transistors.

Scaling multi-gate transistors has not been without consequence, however. As the dimensions of these fundamental building blocks of microelectronic circuitry are reduced and as the sheer number of fundamental building blocks fabricated in a given region is increased, the constraints on including passive features among active devices have increased, e.g., for system-on-chip (SoC) based architectures.

DESCRIPTION OF THE EMBODIMENTS

Figure 1:
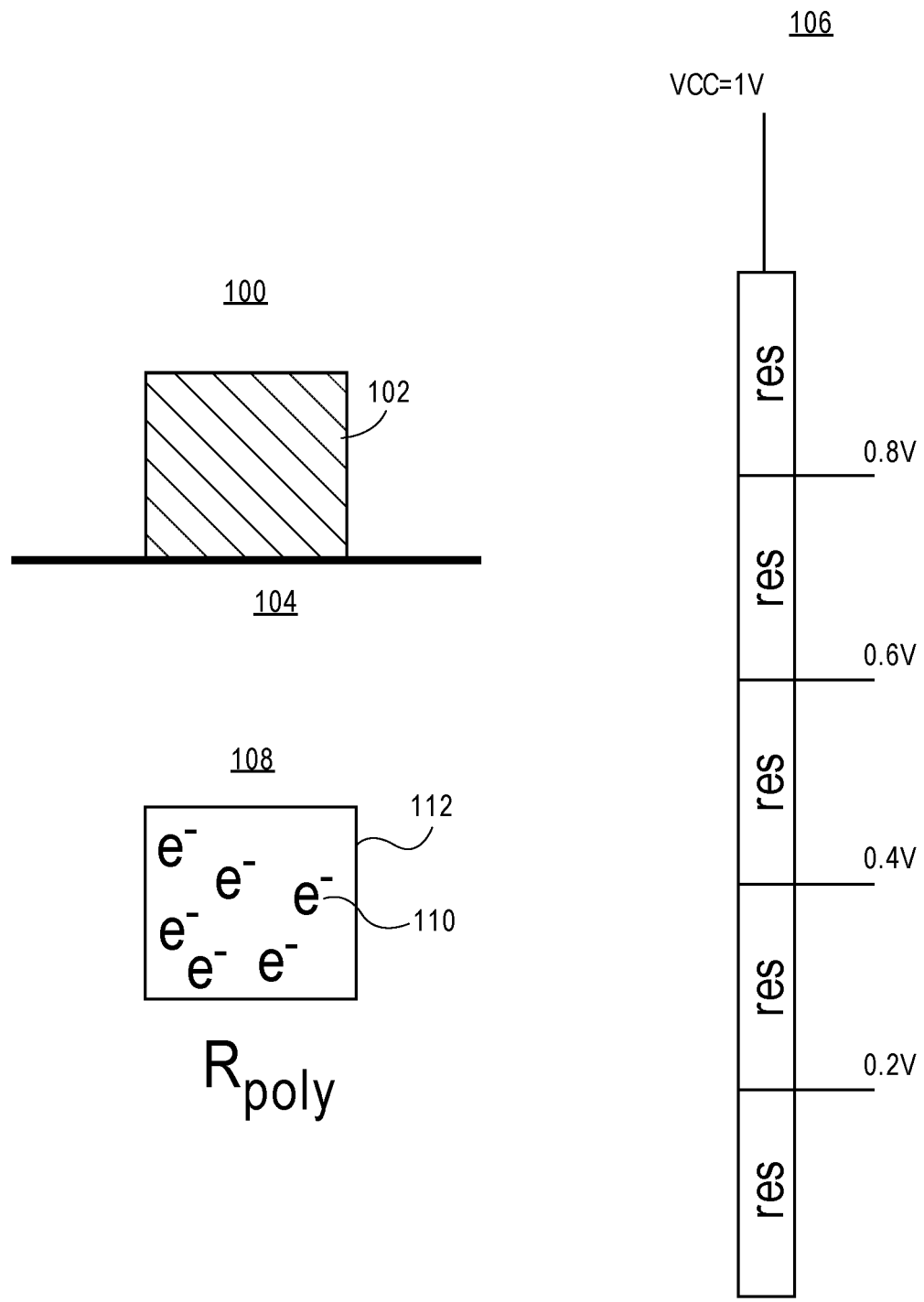
FIG. 1 illustrates a conventional polysilicon resistor.

Metal-oxide-polysilicon tunable resistors and methods of fabricating metal-oxide-polysilicon tunable resistors are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to metal-oxide-polysilicon tunable resistor structures and manufacturing methods for such technology. Embodiments may include one or more of complimentary metal oxide semiconductor (CMOS) devices, high-K gate dielectrics and/or metal gate processing schemes, metal-oxide-polysilicon tunable resistors for flexible circuit design, precision resistors, resistive ladders.

To provide context, polysilicon (polycrystalline silicon) resistors are often used when precise resistive loads are needed in circuits and other I/O blocks. However, polysilicon resistors have a fixed resistance and typically the resistance is uniform along the length of the resistor. Embodiments described herein introduces a method to tune the total resistance of a polysilicon resistor. Furthermore, a single polysilicon resistor can be tuned to have non-uniform resistance along its length such that resistive voltage dividers can achieve very fine voltage granularity.

In accordance with one or more embodiments described herein, a metal gate and oxide is deposited and patterned on a polysilicon resistor. By applying a bias on the gate, the resistance of the underlying section of the polysilicon can be manipulated by charge accumulation/depletion. By extension, several independently-biased gate contacts can be used to change the polysilicon resistance differently along its length. It is to be appreciated that, subsequent to manufacture, there are often reasons to change the resistance of a polysilicon resistor. For example, if a circuit block relies on two matched resistors, then the mismatch can be corrected by tuning one of the resistors. Alternatively, two circuit blocks or one circuit block with multiple operating modes may be implemented to share one resistor array. Depending on the exact usage at any particular time, the resistor may be implemented to have a different value.

To provide further context, currently, in order to change the resistance of a polysilicon resistor, the connections inside a large array of polysilicon resistors are manipulated to change the total resistance. This can be achieved by disconnecting portions of the array by fuses. However, the disconnected resistors are wasted areas and it is a permanent change. By contrast, one or more embodiments described herein provides the ability to tune the resistance non-permanently by changing a gate electrode bias. Such embodiments may be implemented to eliminate the waste of disconnecting resistors as well as increasing the versatility of a resistor array since its resistance can be modulated to fit the changing needs of surrounding circuitry. As transistors age, it is also possible that the resistive load needed will change, which can be accommodated for by one or more embodiments of the present invention. It is to be appreciated that when used as a voltage divider, the voltage readout values of conventional polysilicon resistors are fixed and determined by its position along the resistor. As the circuit needs change, embodiments described herein allow for the voltage readout values to change depending on the biases on the gate nodes.

To illustrate principles associated with the state-of-the-art, FIG. 1 illustrates a conventional polysilicon resistor. Referring to FIG. 1, a conventional polysilicon resistor 100 with a fixed resistance is often used as a resistive load or as a voltage divider. The conventional polysilicon resistor 100 includes a polysilicon structure 102 formed on an isolation structure 104. Total resistance and the voltage provided by each of the voltage taps (e.g. 0.2V, 0.4V, 0.6V, 0.8V, as shown as item 106 in FIG. 1) is determined by the doping concentration 108 (shown as dopants 108 in polysilicon 112 of structure 108 of FIG. 1) used during manufacture. As such, the voltage taps cannot be changed and will also be subject to manufacturing variations.

Embodiments described herein involves the addition of metal/oxide gate stack on/beside/surrounding a polysilicon resistor. One or several of such gate electrodes can be used, and each can potentially be independently biased depending on surrounding control circuitry and usage scenario. As examples, FIG. 2 illustrates cross-sectional and top-down views of tunable polysilicon resistors, in accordance with an embodiment of the present invention.

Figure 2:
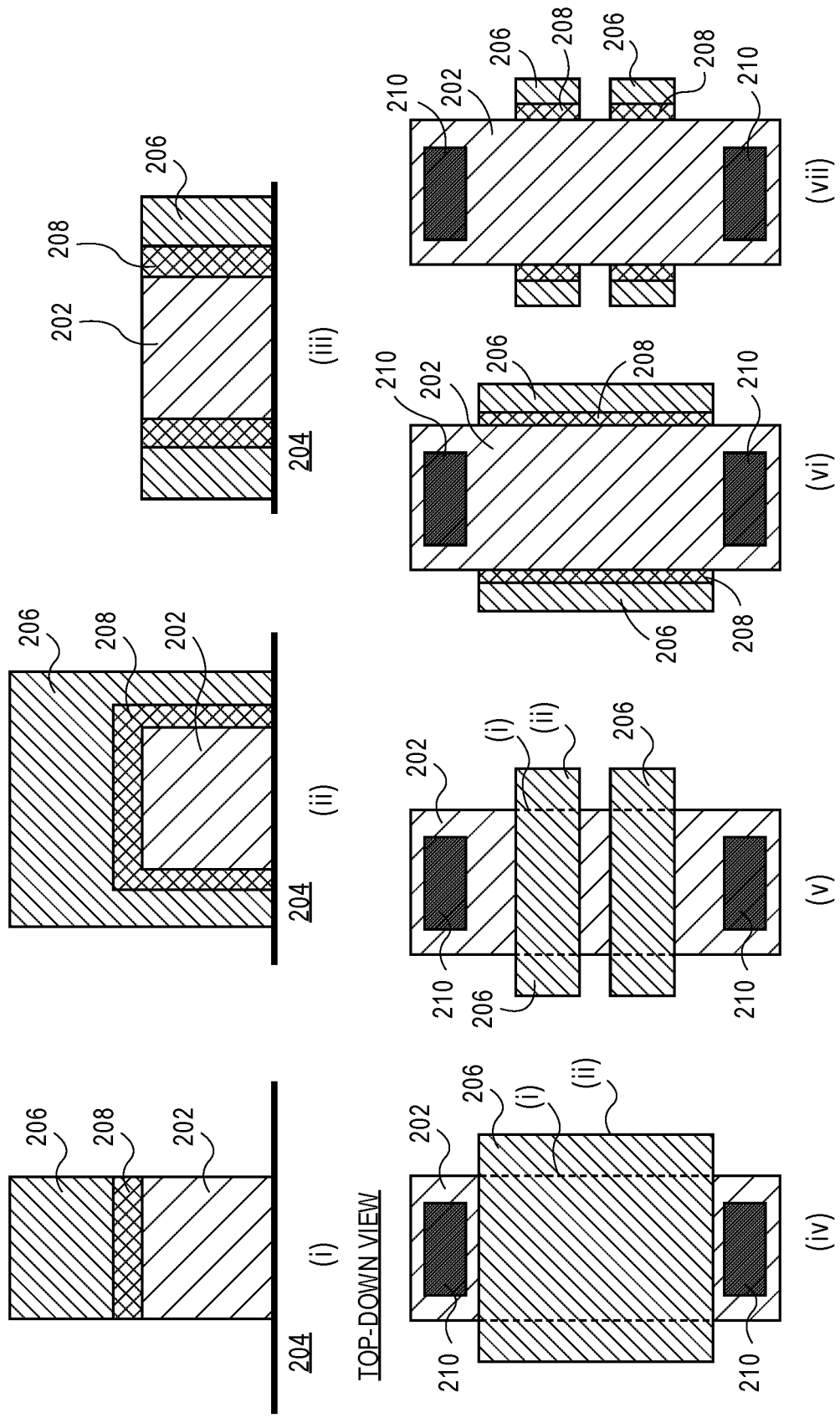
FIG. 2 illustrates cross-sectional and top-down views of tunable polysilicon resistors, in accordance with an embodiment of the present invention.

Referring to FIG. 2, different arrangement for polysilicon resistors are provided for a polysilicon resistor structure 202 on an isolation region 204. A metal gate 206 and gate oxide 208 are formed as associated with the polysilicon resistor structure 202. In one embodiment, the gate oxide layer is a high-k dielectric layer. In the plan views, contacts 210 to the polysilicon resistor structure 202 are also illustrated. In an embodiment, then a tunable resistor includes a polysilicon resistor 202 structure disposed above a substrate. As shown in parts (i) and (ii) of FIG. 2, in an embodiment, a gate oxide layer 208 is disposed on the polysilicon resistor structure 202. A metal gate layer 206 is disposed on the gate oxide layer 208. The metal gate layer 208 is for altering a resistance of the polysilicon resistor structure 202 when the metal gate layer 208 is biased. As shown in part (ii) of FIG. 2, in an embodiment, the gate oxide layer 208 and metal gate layer 206 are further disposed on sidewalls of the polysilicon resistor structure 202. As shown in part (iii) of FIG. 2, in an embodiment, the polysilicon resistor 202 has a top surface and a pair of sidewalls. A gate oxide layer 208 disposed on the pair of sidewalls of, but not on the top surface of, the polysilicon resistor structure 202. A metal gate layer 206 is disposed on the gate oxide layer 208.

As seen in the plan views, in one embodiment, the tunable resistor further includes a pair of conductive contacts 210 disposed on the polysilicon resistor structure 202, on either side of the gate oxide layer 208 and the metal gate layer 206. The structures (iv) and (v) of the plan views can correspond to cross-sectional views (i) or (ii). The structures (vi) and (vii) of the plan views can correspond to cross-sectional view (iii). As is also depicted in plan view structures (v) and (vii), in an embodiment, the tunable resistor further includes a second gate oxide layer 208 disposed on the polysilicon resistor 202 adjacent to but not in contact with the gate oxide layer 208, and a second metal gate layer disposed on the second gate oxide layer. The second metal gate layer may implemented for altering a resistance of the polysilicon resistor structure 202 when the second metal gate layer is biased. In one embodiment, the second metal gate layer can be biased independent from biasing the metal gate layer 206.

In an embodiment, the tunable resistors of FIG. 2 are fabricated above a bulk single crystalline silicon substrate, and the polysilicon resistor structure 202 is disposed on an isolation region disposed in the bulk single crystalline silicon substrate. In an embodiment, as described in greater detail below, the polysilicon resistor structure 202 is disposed between and laterally adjacent to, but not on, a semiconductor fin of a semiconductor device formed above the substrate. In an embodiment, as described in greater detail below, the polysilicon resistor structure 202 is disposed over a semiconductor fin formed above the substrate. In an embodiment, the tunable resistor 202 further includes a conductive contact (not shown) disposed on the metal gate layer 206, the conductive contact electrically connected to the metal gate layer 206.

Figure 3:
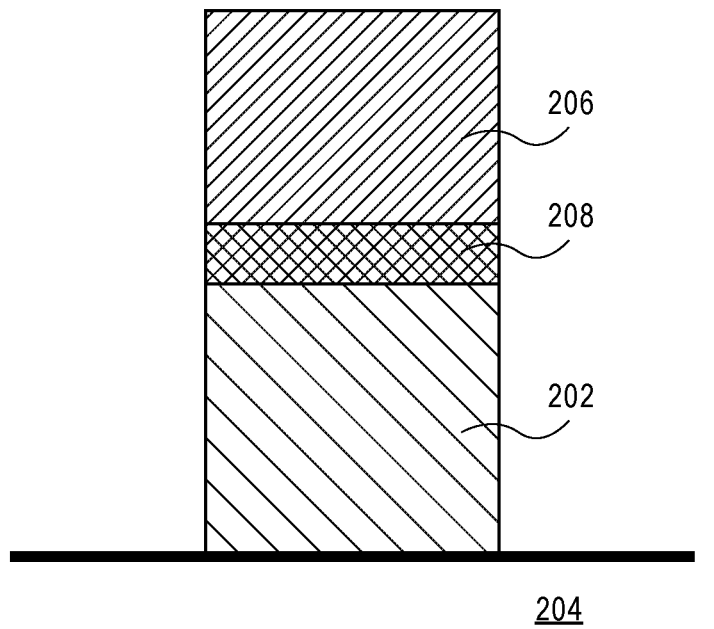
FIG. 3 illustrates a polyresistor having the structure (i) of FIG. 2 and associated effects of gate biasing (VG), in accordance with an embodiment of the present invention.
Figure 3:
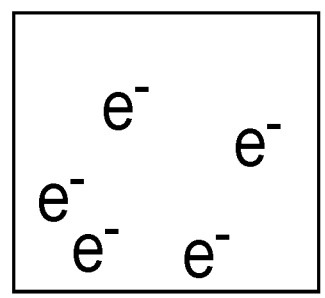
Figure 3:
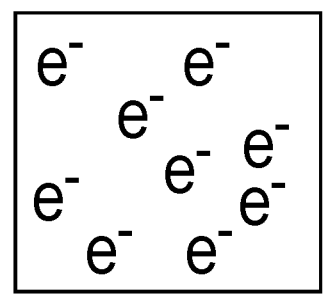

In an embodiment, by applying a positive or negative bias on the gate electrode(s) 206, the underlying section of the polysilicon resistor 202 can be depleted/accumulated, altering the resistance of the polysilicon resistor 202. FIG. 3 illustrates a polyresistor having the structure (i) of FIG. 2 and associated effects of gate biasing (VG), in accordance with an embodiment of the present invention. Referring to FIG. 3, gate biasing is applied as either higher (>Rpoly) or lower (<Rpoly) than its unbiased state (R poly). The schematic 300 shows the effect where VG<0. The schematic 302 shows the effect where VG>0.

Figure 4:
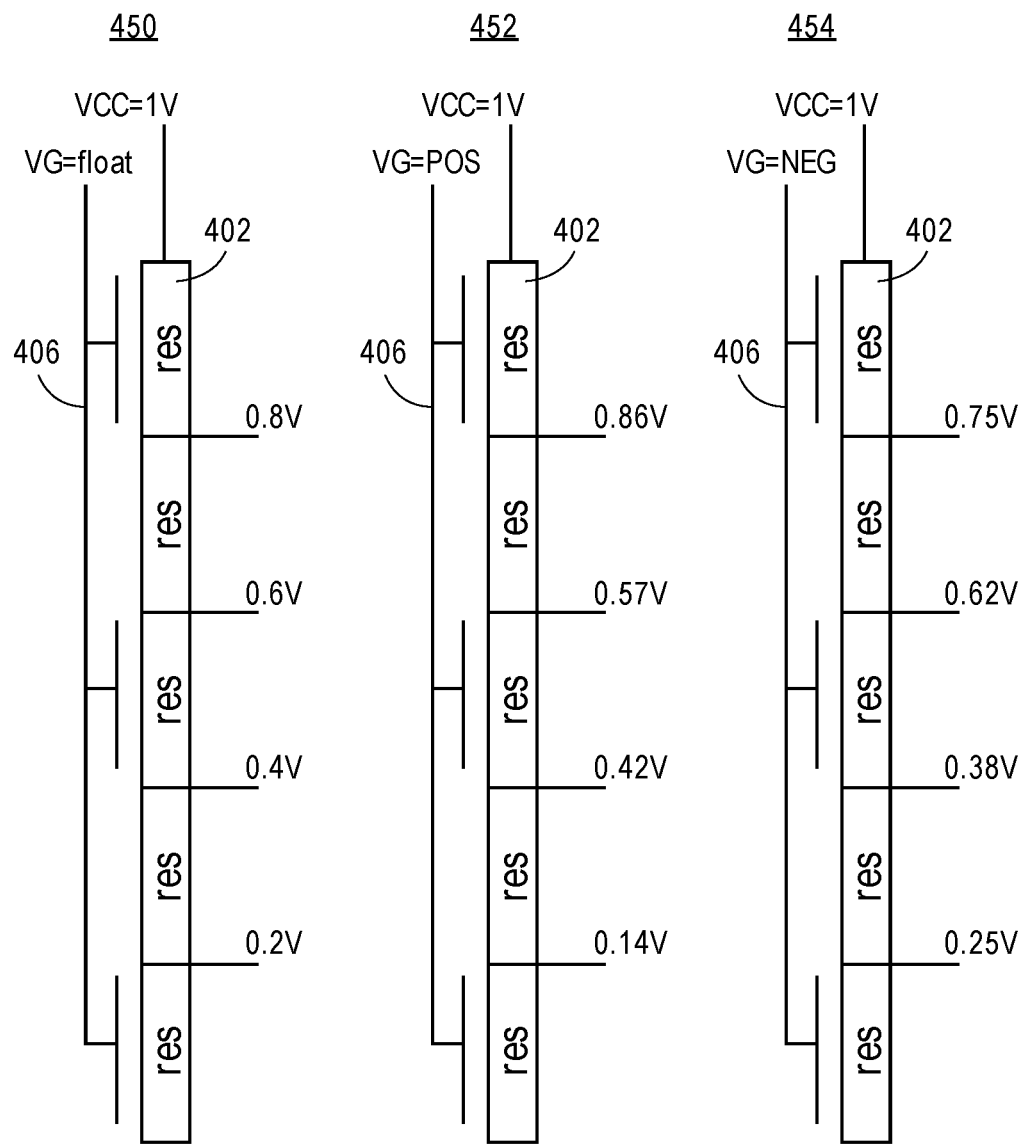
FIG. 4 illustrates the effect of various gate voltage application schematically with three connected gate electrodes and corresponding polysilicon resistor structures, in accordance with an embodiment of the present invention.

In an embodiment, when used as a resistive ladder, voltage taps can be used in a conventional manner by leaving the gate electrodes floating. Alternatively, the voltage taps can be positively or negatively biased to achieve the targeted voltage tap values. FIG. 4 illustrates the effect of various gate voltage application schematically with three connected gate electrodes 406 and corresponding polysilicon resistor structures 402, in accordance with an embodiment of the present invention. Referring to FIG. 4, schematic 450 shows a scenario where voltage taps are used in a conventional manner by leaving the gate electrodes 406 floating (VG=float). Schematic 452 shows a scenario where voltage taps are manipulated by positively biasing the gate electrodes 406 (VG=POS, i.e., >0). Schematic 454 shows a scenario where voltage taps are manipulated by positively biasing the gate electrodes 406 (VG=NEG, i.e., <0). It is to be appreciated that independently biased gate electrodes may be implemented for increased control over the voltage taps.

In an embodiment, the ability to change polysilicon resistance via gate electrode bias can be used for resistive load matching (e.g., to correct for manufacturing variations or to account for transistor aging). It can also allow one resistor array to serve multiple functions. In an embodiment, a method of tuning a resistance of a passive resistor device includes providing a polysilicon resistor element having a first resistance. The method also includes biasing a gate electrode coupled to the polysilicon resistor element to change the first resistance to a second, different, resistance. In one embodiment, the second resistance is less than the first resistance. In one embodiment, the second resistance is greater than the first resistance. In general, embodiments described herein may be implemented to provide additional functionality on a polysilicon resistor that can either save area/cost or provide better performance, or both.

To provide further context, as dimensions of the MOSFET continued to be scaled down in recent technology nodes, polysilicon depletion became an increasingly severe problem. As a result, gate electrodes are now being formed from metal again. However, gate electrodes are typically no longer formed strictly from aluminum. In order to achieve desired work functions, the gate electrodes are now usually formed from a transition metal, an alloy of transition metals, or a transition metal nitride. However, adoption of the metal gate also provided advantages to an alternative so-called "gate-last" process. One implementation of the gate-last process involved a so-called "replacement gate" process which allowed use of different metals for the N-FET and P-FET in the circuit.

Generally, in accordance with an embodiment of the present invention, approaches described herein involve process integration schemes that enable fabrication of a metal-oxide-polysilicon tunable resistor element and high-k/metal gate CMOS technology integration. More specifically, in an embodiment, a lithography and etch patterning process is used to recess a dummy polysilicon structure prior to replacement gate processing in order to effectively bury a polysilicon gate underneath an inter-layer dielectric oxide film. The preserved polysilicon gate then has gate electrodes formed thereon to provide a metal-oxide-polysilicon tunable resistor structure.

Furthermore, embodiments described herein may be compatible with planar type devices and architectures, but may also be compatible with non-planar architectures. Thus, in accordance with one or more embodiments of the present invention, metal-oxide-polysilicon tunable resistor structure formation methods on non-planar high-k/metal gate technologies are also described.

As described in greater detail below in association the Figures, one or more embodiments described herein are directed to process integration schemes that enable polysilicon preservation in certain regions during high-k and metal gate CMOS technology fabrication. The polysilicon is preserved for later fabrication of a fuse element, e.g., which is patterned during a poly patterning process. Lithography processing may be performed to enable the polysilicon preservation portion of the integration scheme. In one such embodiment, a poly line for ultimate application as a metal-oxide-polysilicon tunable resistor element is exposed while the other poly gate regions are covered by photoresist. Dry etch processing can subsequently be performed, during which the metal-oxide-polysilicon tunable resistor element is etched and recessed. In one such embodiment, a differential poly thickness between the fuse element and the surrounding standard poly gate structures is achieved in the etch and recess process. A dummy gate and gate replacement process may then be used to fabricate high-K and metal gate based transistors in the standard gate regions. Then, following a metal gate fill and polish process, resistor areas may be opened to facilitate gate formation on polysilicon resistor structures. Contact formation may also be implemented to allow contact to the polysilicon resistor structure of the gate electrode. It is to be appreciated that structures and processes described herein may be integratable with CMOS technology.

FIGS. 5A-5I illustrate cross-sectional views representing various operations in a method of fabricating a metal-oxide-polysilicon tunable resistor, in accordance with an embodiment of the present invention.

Figure 5A:
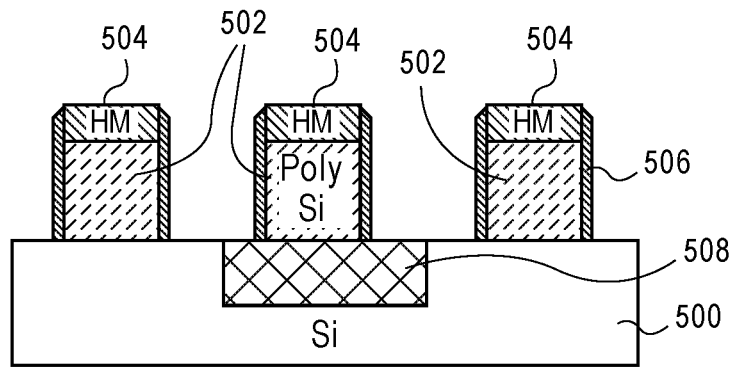
FIGS. 5A-5I illustrate cross-sectional views representing various operations in a method of fabricating a metal-oxide-polysilicon tunable resistor, in accordance with an embodiment of the present invention.
Figure 5B:
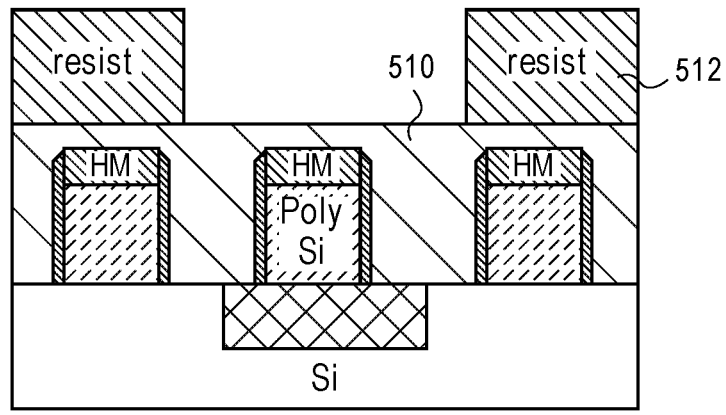
Figure 5C:
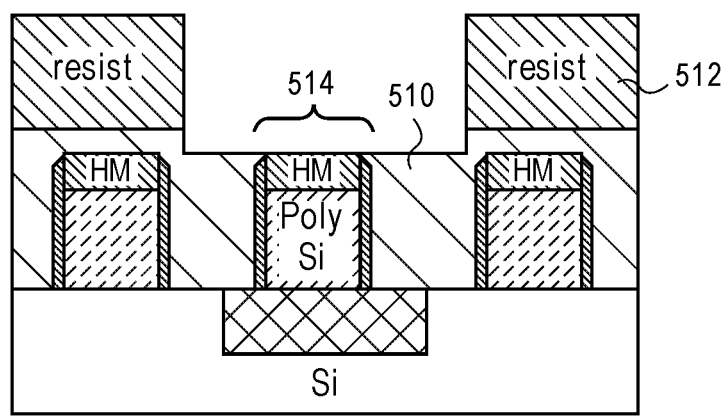
Figure 5D:
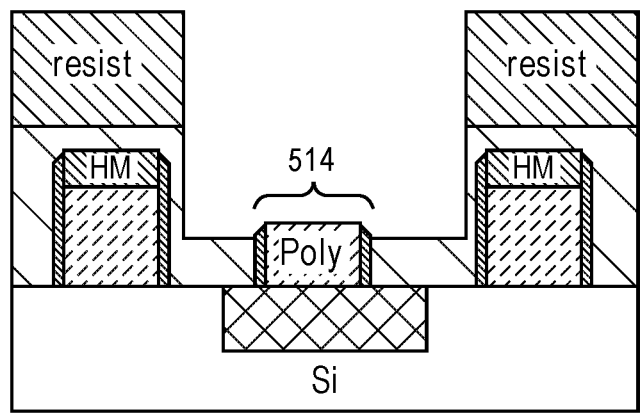
Figure 5E:
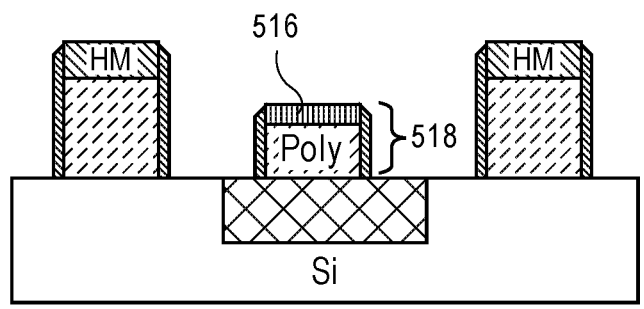
Figure 5F:
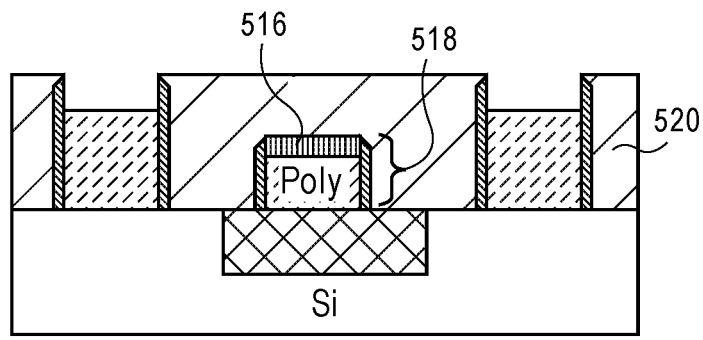
Figure 5G:
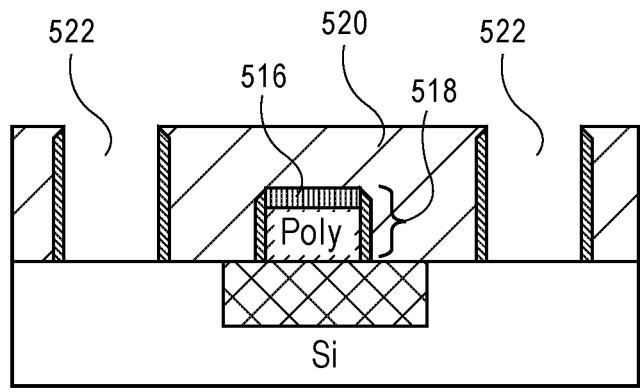
Figure 5H:
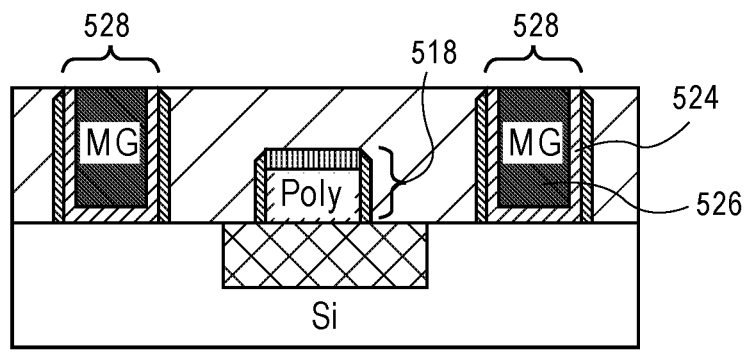
Figure 5I:
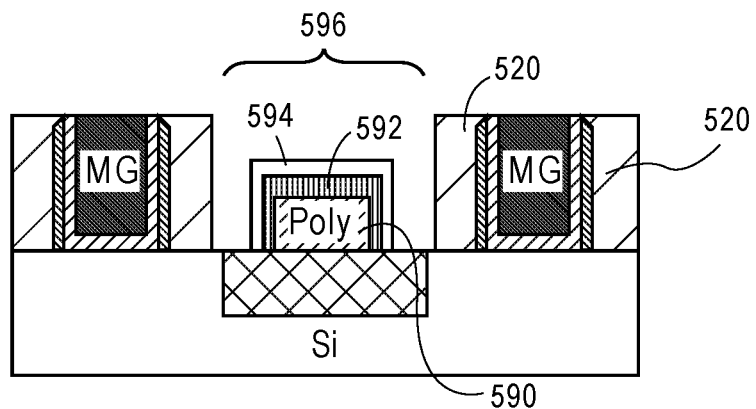

Referring to FIG. 5A, polycrystalline silicon lines 502 are patterned above a substrate 500, such as a single crystalline silicon substrate. The polycrystalline silicon lines 502 may include a hardmask (HM) 504 and/or spacers 506, as depicted in FIG. 5A. Although not shown, an insulating layer may be disposed between the substrate 502 and the polycrystalline silicon lines 502. One or more of the lines may be fabricated on an isolation region 508. Such a region can be formed with deposited oxide films such as by chemical vapor deposition (CVD), high density plasma deposition (HDP), or spin on dielectrics. An anti-reflective coating layer 510 and patterned photoresist layer 512 is then formed (which may involve a resist freeze operation) on the structure of FIG. 5A, as depicted in FIG. 5B. A polycrystalline silicon line intended for metal-oxide-polysilicon tunable resistor formation is exposed by the patterned photoresist layer 512. Referring to FIG. 5C, the anti-reflective coating layer 510 is recessed, e.g., by an etch process, to expose the polycrystalline silicon line 514 through the anti-reflective coating layer 510. The hardmask layer and upper spacer portions are then removed to expose the polysilicon of the polycrystalline silicon line 514, as depicted in FIG. 5D. Referring to FIG. 5E, an implant/anneal process may performed to dope the polysilicon of the polycrystalline silicon line 514. A hardmask layer 516 may then be formed to protect the doped polysilicon of the polycrystalline silicon line 514 in subsequent processing operations. The resulting structure is a resistor structure 518. As is also depicted in FIG. 5E, resist and anti-reflective coating layers may also be removed. An inter-layer dielectric layer 520, formed in a similar method as 508 (CVD, HDP, spin on dielectrics) is then formed above the resulting structures, as depicted in FIG. 5F. The inter-layer dielectric layer 520 is patterned to expose hardmasks of the remaining polycrystalline silicon lines, which may ultimately be removed, as depicted in FIG. 5F. However, the resistor structure 518 is protected from the exposing process since it is recessed lower than the adjacent polycrystalline silicon structures. Referring to FIG. 5G, polycrystalline silicon lines are removed in a replacement gate process to provide trenches 522. Subsequently, a high-k gate dielectric layer 524 and metal gate electrode 526 is formed in trenches 522 to form transistor structures 528, as depicted in FIG. 5H. Referring to FIG. 5I, the resistor structure 518 is then exposed and processing operations are performed to provide a metal-oxide-polysilicon tunable resistor 596 having a polysilicon resistor structure 590, a gate dielectric layer 592, and a metal gate electrode 594. Subsequent processing may also include contact formation to the polysilicon resistor structure 590 and to the metal gate electrode 594.

In another aspect, a metal-oxide-polysilicon tunable resistor structure may be included as an embedded metal-oxide-polysilicon tunable resistor structure with a non-planar architecture. In an embodiment, reference to a non-planar metal-oxide-polysilicon tunable resistor structure is used herein to describe a metal-oxide-polysilicon tunable resistor structure having a polysilicon layer formed over one or more fins protruding from a substrate.

In another aspect, a planar metal-oxide-polysilicon tunable resistor structure may be included with a non-planar architecture. In an embodiment, reference to a planar metal-oxide-polysilicon tunable resistor structure is used herein to describe a metal-oxide-polysilicon tunable resistor structure having a polysilicon layer formed adjacent to, but not over, one or more fins protruding from a substrate.

Figure 6A:
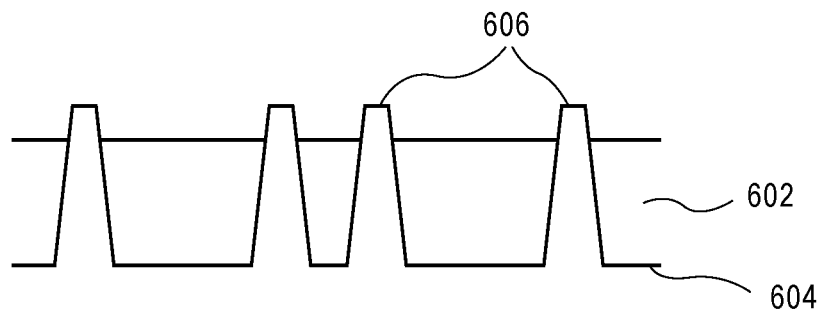
FIGS. 6A-6J illustrate cross-sectional views representing various operations in a method of fabricating a metal-oxide-polysilicon tunable resistor for a non-planar semiconductor device architecture, in accordance with an embodiment of the present invention.
Figure 6B:
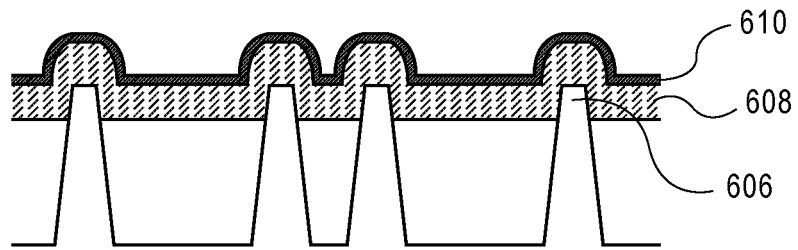
Figure 6C:
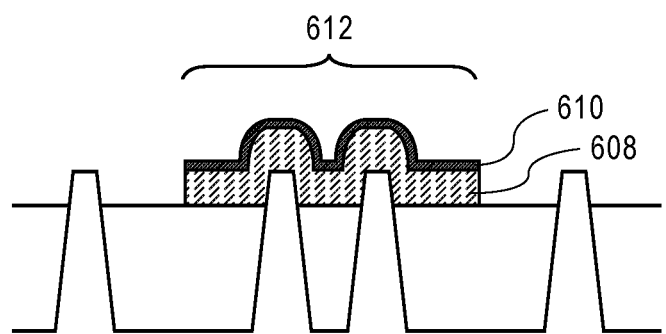
Figure 6D:
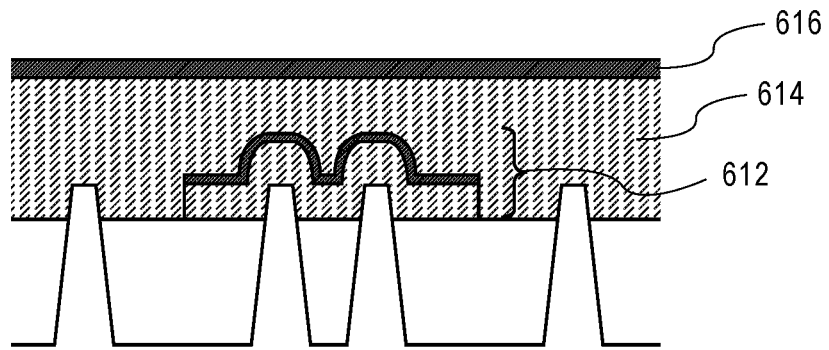
Figure 6E:
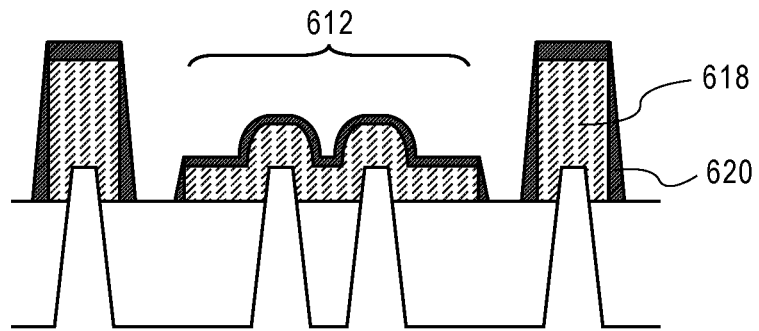
Figure 6F:
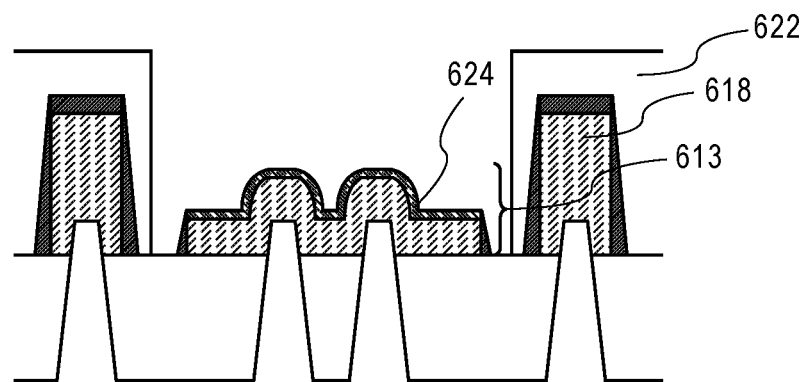
Figure 6G:
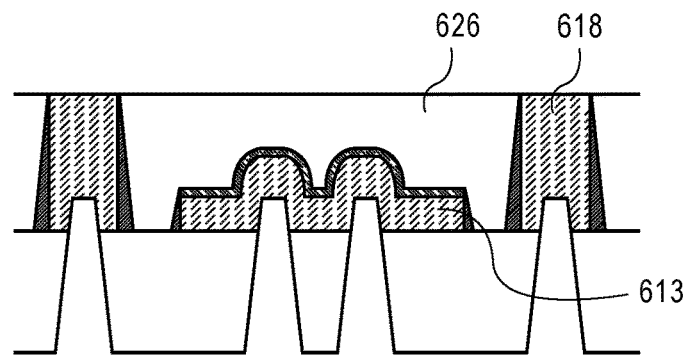
Figure 6H:
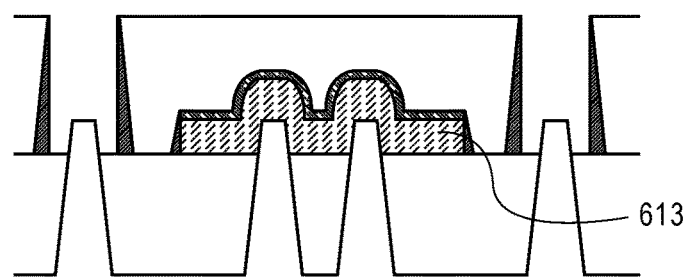
Figure 6I:
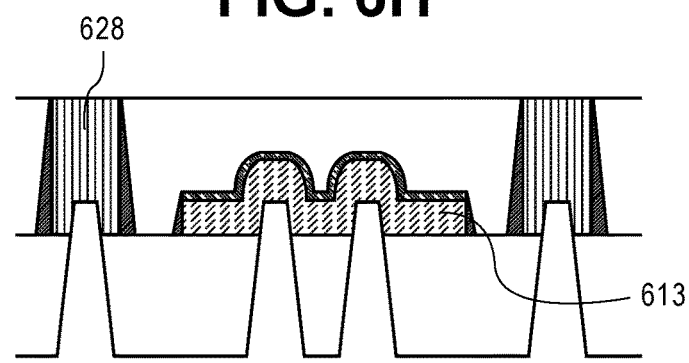
Figure 6J:
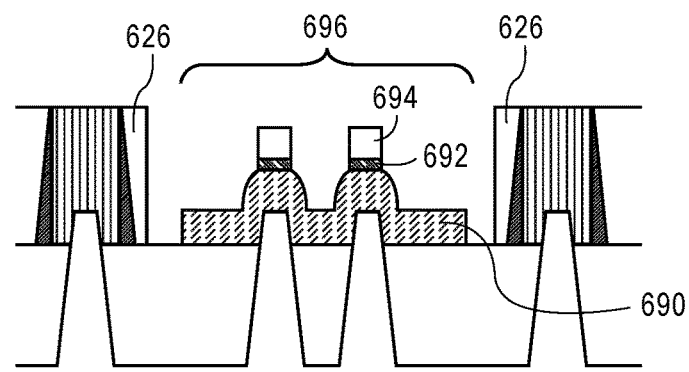

In a first non-planar fabrication approach, FIGS. 6A-6J illustrate cross-sectional views representing various operations in a method of fabricating a metal-oxide-polysilicon tunable resistor for a non-planar semiconductor device architecture, in accordance with an embodiment of the present invention. Referring to FIG. 6A, an isolation layer 602 is formed on a patterned bulk substrate 604 and recessed to leave a plurality of fins 606 exposed. A first layer of polysilicon 608 and a silicon nitride hardmask 610 is then formed conformal with the plurality of fins 606, as depicted in FIG. 6B. Although not depicted, an insulating layer may first be formed on fins 606 to ultimately insulate polysilicon layer 608 from the fin material. Referring to FIG. 6C, a patterning process, e.g., a lithography and etch process, of the first layer of polysilicon 608 and the silicon nitride hardmask 610 is performed to provide a resistor precursor structure 612. A second layer of polysilicon 614 is then formed above the resistor precursor structure 612. The second layer of polysilicon 614 is planarized, e.g., by a chemical mechanical polishing process, and a second hardmask layer 616 is formed thereon, as depicted in FIG. 6D. Referring to FIG. 6E, a patterning process, e.g., a lithography and etch process, of the second layer of polysilicon 614 and the second hardmask 616 is performed to provide dummy gate structures 618, which may include spacers 620. The dummy gate structure 618 may then be masked by mask 622, and hardmask 610 is removed from the resistor precursor structure 612. Referring to FIG. 6F, an implant/anneal process may performed to dope the polysilicon of the polycrystalline silicon line 612. A hardmask layer 624 may then be formed to protect the doped polysilicon of the polycrystalline silicon line 612 in subsequent processing operations. The resulting structure is a resistor structure 613, as depicted in FIG. 6F. Referring to FIG. 6G, mask 622 is removed and an inter-layer dielectric layer 626 (e.g., silicon oxide) is formed over the dummy gate structures 618 and the resistor structure 613. The inter-layer dielectric layer 626 is planarized to expose the polysilicon of the dummy gate structure 618, but to retain resistor structure 613 as unexposed. The polysilicon of the dummy gate structures 618 is then removed, but the resistor structure 613 is retained, as depicted in FIG. 6H. Referring to FIG. 6I, permanent gate electrodes 628, e.g., metal gate electrodes (with, possibly, high-k gate dielectric layers), are formed. Referring to FIG. 6J, the resistor structure 613 is then exposed and processing operations are performed to provide a metal-oxide-polysilicon tunable resistor 696 having a polysilicon resistor structure 690, a gate dielectric layer 692, and a metal gate electrode 694. Subsequent processing may also include contact formation to the polysilicon resistor structure 690 and to the metal gate electrode 694.

Figure 7A:
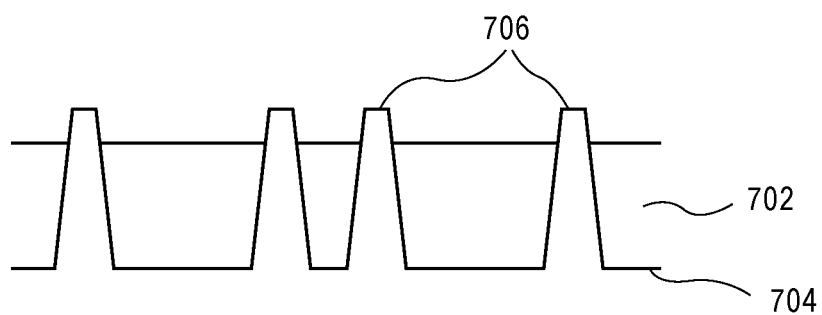
FIGS. 7A-7J illustrate cross-sectional views representing various operations in another method of fabricating a metal-oxide-polysilicon tunable resistor for a non-planar semiconductor device architecture, in accordance with an embodiment of the present invention.
Figure 7B:
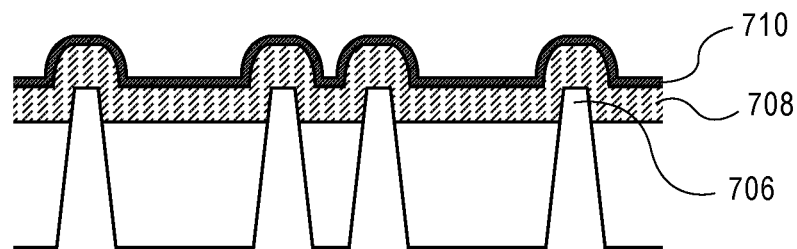
Figure 7C:
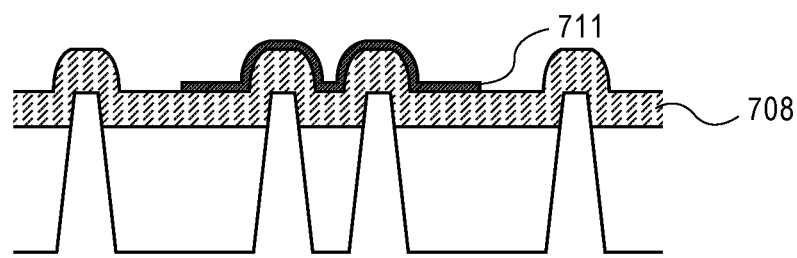
Figure 7D:
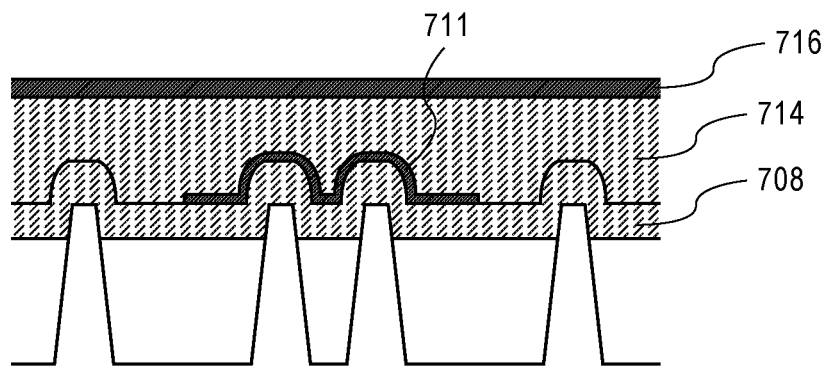
Figure 7E:
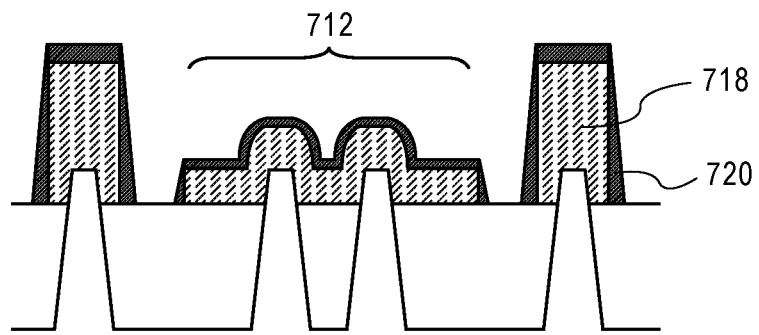
Figure 7F:
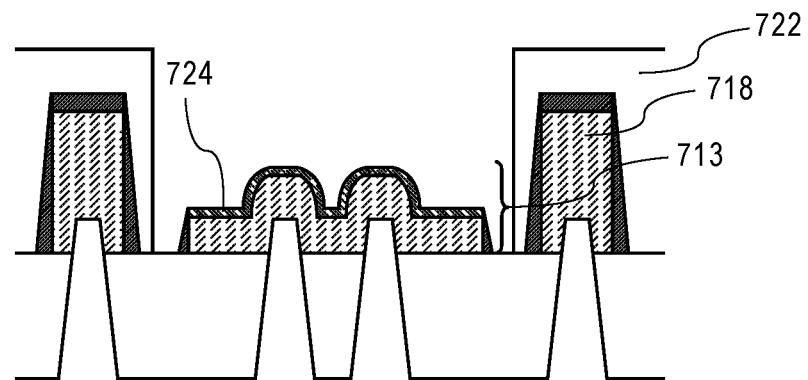
Figure 7G:
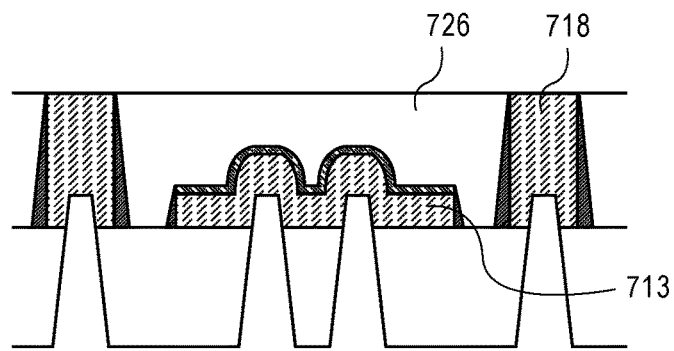
Figure 7H:
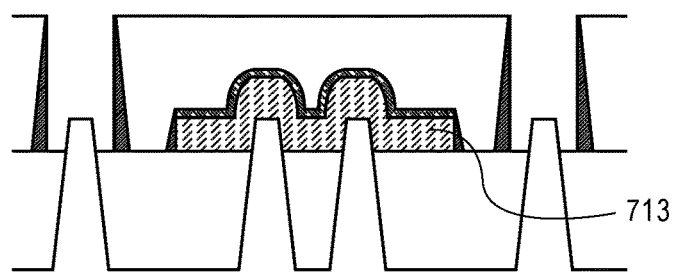
Figure 7I:
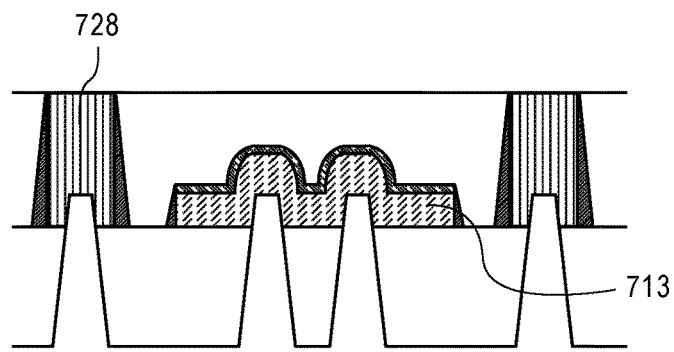
Figure 7J:
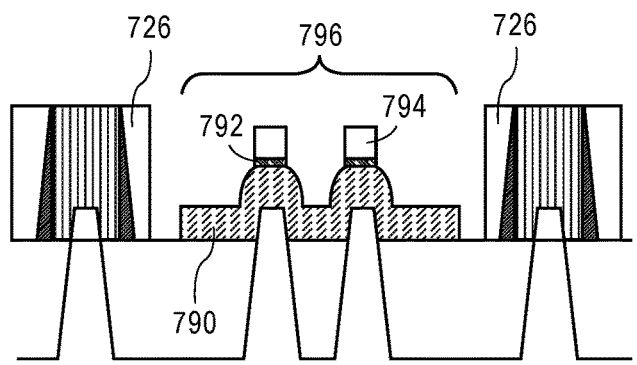

In a second non-planar fabrication approach, FIGS. 7A-7J illustrate cross-sectional views representing various operations in another method of fabricating a metal-oxide-polysilicon tunable resistor for a non-planar semiconductor device architecture, in accordance with an embodiment of the present invention. Referring to FIG. 7A, an isolation layer 702 is formed on a patterned bulk substrate 704 and recessed to leave a plurality of fins 706 exposed. A first layer of polysilicon 708 and a silicon nitride hardmask 710 is then formed conformal with the plurality of fins 706, as depicted in FIG. 7B. Although not depicted, an insulating layer may first be formed on fins 706 to ultimately insulate polysilicon layer 708 from the fin material. Referring to FIG. 7C, a patterning process, e.g., a lithography and etch process, of the silicon nitride hardmask 710 is performed to provide a resistor mask 711. A second layer of polysilicon 714 is then formed above the resistor mask 711. The second layer of polysilicon 714 is planarized, e.g., by a chemical mechanical polishing process, and a second hardmask layer 716 is formed thereon, as depicted in FIG. 7D. Referring to FIG. 7E, a patterning process, e.g., a lithography and etch process, of the first layer of polysilicon 708, the second layer of polysilicon 714, and the second hardmask 716 is performed to provide dummy gate structures 718, which may include spacers 720, and to provide resistor precursor structure 712. The dummy gate structure 718 may then be masked by a mask 722, and hardmask 711 is removed from the resistor precursor structure 712. Referring to FIG. 7F, an implant/anneal process may performed to dope the polysilicon of the polycrystalline silicon line 712. A hardmask layer 724 may then be formed to protect the doped polysilicon of the polycrystalline silicon line 712 in subsequent processing operations. The resulting structure is a resistor structure 713, as depicted in FIG. 7F. Referring to FIG. 7G, mask 722 is removed and an inter-layer dielectric layer 726 (e.g., silicon oxide) is formed over the dummy gate structures 718 and the resistor structure 713. The inter-layer dielectric layer 726 is planarized to expose the polysilicon of the dummy gate structure 718, but to retain resistor structure 713 as unexposed. The polysilicon of the dummy gate structures 718 is then removed, but the resistor structure 713 is retained, as depicted in FIG. 7H. Referring to FIG. 7I, permanent gate electrodes 728, e.g., metal gate electrodes (with, possibly, high-k gate dielectric layers), are formed. Referring to FIG. 7J, the resistor structure 713 is then exposed and processing operations are performed to provide a metal-oxide-polysilicon tunable resistor 796 having a polysilicon resistor structure 790, a gate dielectric layer 792, and a metal gate electrode 794. Subsequent processing may also include contact formation to the polysilicon resistor structure 790 and to the metal gate electrode 794. The above approach may be referred to as a buried hardmask stacked polysilicon resistor approach.

Figure 8A:
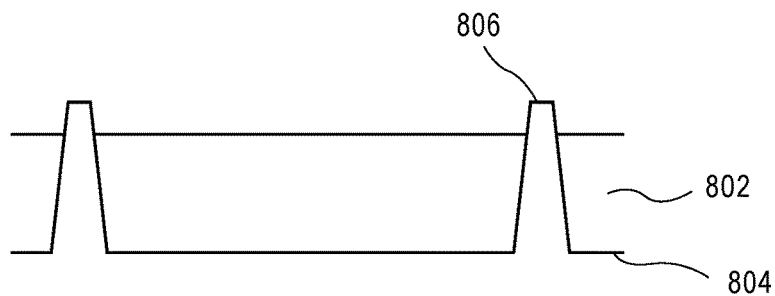
FIGS. 8A-8J illustrate cross-sectional views representing various operations in another method of fabricating a metal-oxide-polysilicon tunable resistor for a non-planar semiconductor device architecture, in accordance with an embodiment of the present invention.
Figure 8B:
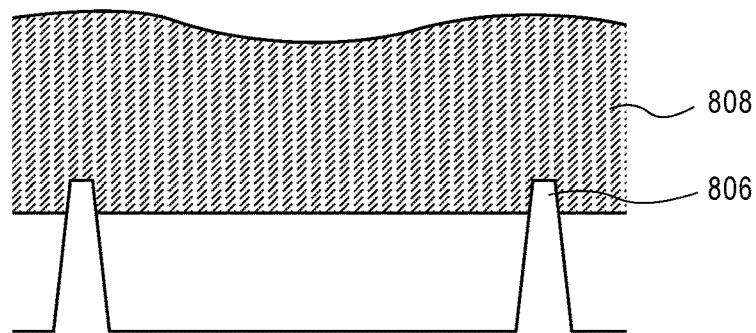
Figure 8C:
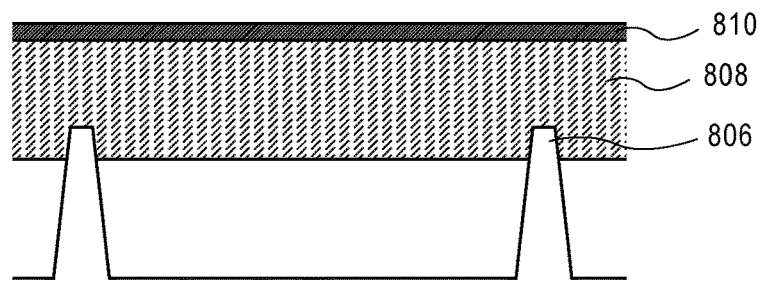
Figure 8D:
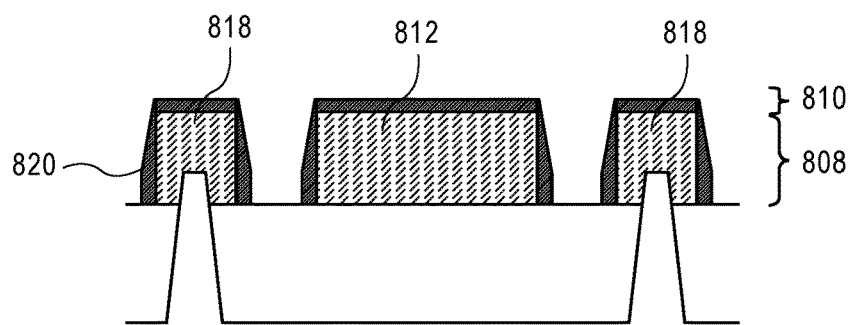
Figure 8E:
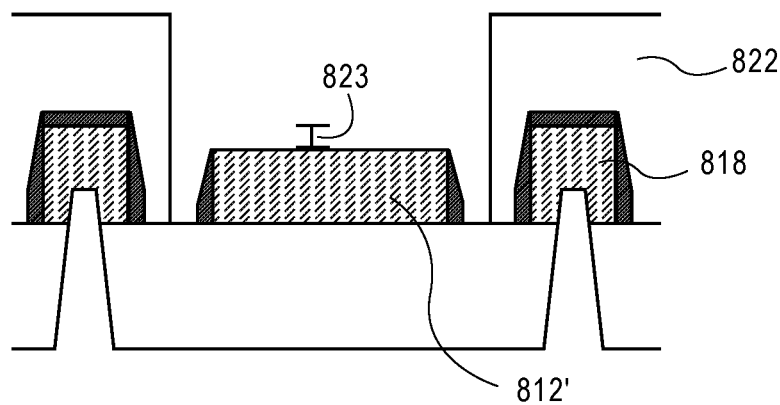
Figure 8F:
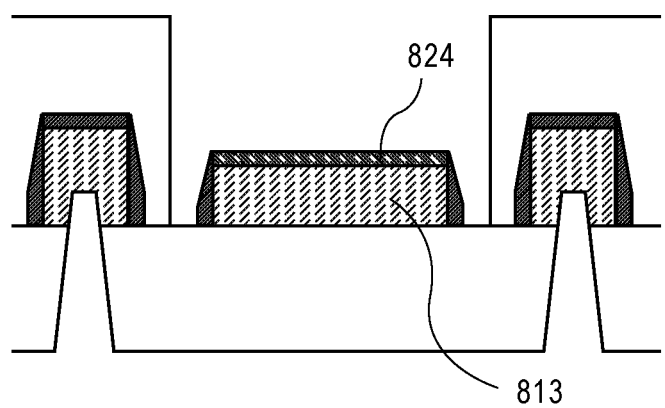
Figure 8G:
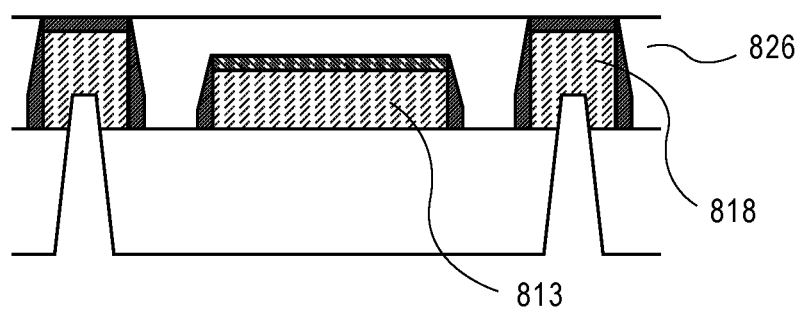
Figure 8H:
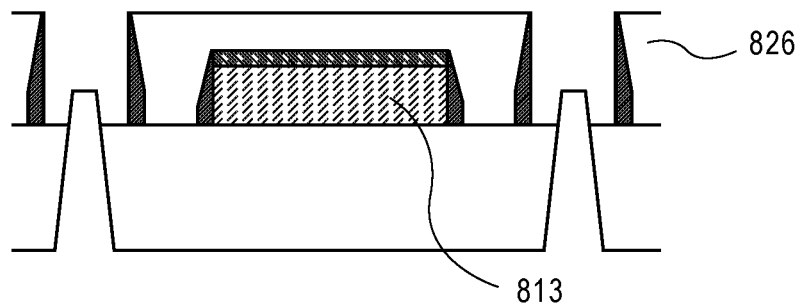
Figure 8I:
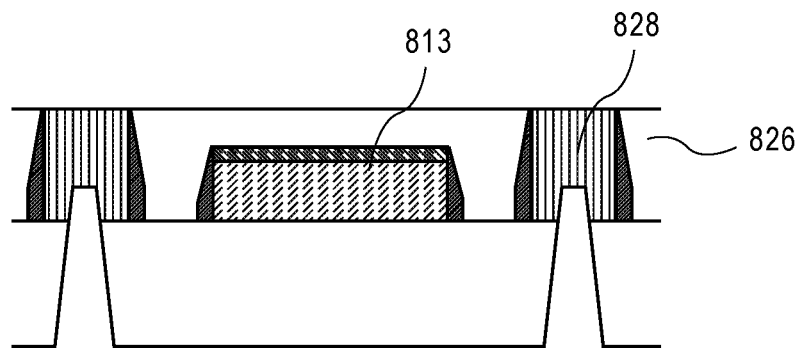
Figure 8J:
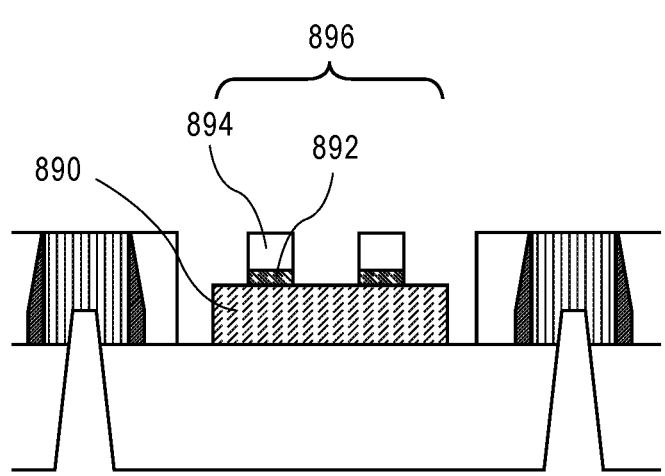

In a third non-planar fabrication approach, FIGS. 8A-8J illustrate cross-sectional views representing various operations in another method of fabricating a metal-oxide-polysilicon tunable resistor for a non-planar semiconductor device architecture, in accordance with an embodiment of the present invention. Referring to FIG. 8A, an isolation layer 802 is formed on a patterned bulk substrate 804 and recessed to leave a plurality of fins 806 exposed. A layer of polysilicon 808 is then formed above the fins 806, as depicted in FIG. 8B. Although not depicted, an insulating layer may first be formed on fins 806 to ultimately insulate polysilicon layer 808 from the fin material. Referring to FIG. 8C, the layer of polysilicon 808 is planarized, e.g., by a chemical mechanical planarization process, and a silicon nitride hardmask 810 is then formed. A patterning process, e.g., a lithography and etch process, of the silicon nitride hardmask 810 and the layer of polysilicon 808 is then performed to provide dummy gate structures 818 and a resistor precursor structure 812, which may include spacers 820, as depicted in FIG. 8D. Referring to FIG. 8E, the dummy gate structure 818 may then be masked by mask 822. The exposed resistor precursor structure 812 is then recessed, e.g., by an etch process. The recessing 823, in one embodiment, involves removal of the hardmask as well as a portion of the polysilicon layer to provide modified resistor precursor structure 812'. Referring to FIG. 8F, an implant/anneal process may performed to dope the polysilicon of the polycrystalline silicon line 812'. A hardmask layer 824 may then be formed to protect the doped polysilicon of the polycrystalline silicon line 812' in subsequent processing operations. The resulting structure is a resistor structure 813, as depicted in FIG. 8F. Referring to FIG. 8G, mask 822 is removed and an inter-layer dielectric layer 826 (e.g., silicon oxide) is formed over the dummy gate structures 818 and the resistor structure 813. The inter-layer dielectric layer 826 is planarized to expose the polysilicon of the dummy gate structure 818, but to retain resistor structure 813 as unexposed. The polysilicon of the dummy gate structures 818 is then removed, but the resistor structure 813 is retained, as depicted in FIG. 8H. Referring to FIG. 8I, permanent gate electrodes 828, e.g., metal gate electrodes (with, possibly, high-k gate dielectric layers), are formed. Referring to FIG. 8J, the resistor structure 813 is then exposed and processing operations are performed to provide a metal-oxide-polysilicon tunable resistor 896 having a polysilicon resistor structure 890, a gate dielectric layer 892, and a metal gate electrode 894. Subsequent processing may also include contact formation to the polysilicon resistor structure 890 and to the metal gate electrode 894. The above approach may be referred to as a recessed polysilicon resistor approach.

Thus, one or more embodiments of the present invention address suitable attributes of a metal-oxide-polysilicon tunable resistor structure. For example, in an embodiment, a metal-oxide-polysilicon tunable resistor structure described herein is compatible with current and future process technologies, e.g., the metal-oxide-polysilicon tunable resistor structures detailed are compatible with a trigate and/or high-k/metal gate process flow where polysilicon of active devices is sacrificial and replaced with a metal gate architecture on a non-planar trigate process.

In the above described approaches, an exposed plurality of dummy gates may ultimately be replaced in a replacement gate process scheme. In such a scheme, dummy gate material such as polysilicon may be removed and replaced with permanent gate electrode material. In one such embodiment, a permanent gate dielectric layer is also formed in this process, as opposed to being carried through from earlier processing. In one embodiment, as described above, structures reserved for metal-oxide-polysilicon tunable resistors are blocked from removal of the polysilicon which is preserved for metal-oxide-polysilicon tunable resistor formation.

In an embodiment, the plurality of dummy gates is removed by a dry etch or wet etch process. In one embodiment, the plurality of dummy gates is composed of polycrystalline silicon or amorphous silicon and is removed with a dry etch process including $SF_6$. In another embodiment, the plurality of dummy gates is composed of polycrystalline silicon or amorphous silicon and is removed with a wet etch process including aqueous $NH_4OH$ or tetramethylammonium hydroxide. In one embodiment, the plurality of dummy gates is composed of silicon nitride and is removed with a wet etch including aqueous phosphoric acid.

Perhaps more generally, one or more embodiments of the present invention may also be directed to a gate aligned contact process. Such a process may be implemented to form contact structures for semiconductor structure fabrication, e.g., for integrated circuit fabrication. In an embodiment, a contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separately patterning of contacts and contact plugs.

Implementations of embodiments of the invention may be formed or carried out on a substrate, such as a semiconductor substrate. In one implementation, the semiconductor substrate may be a crystalline substrate formed using a bulk silicon or a silicon-on-insulator substrate. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 9:
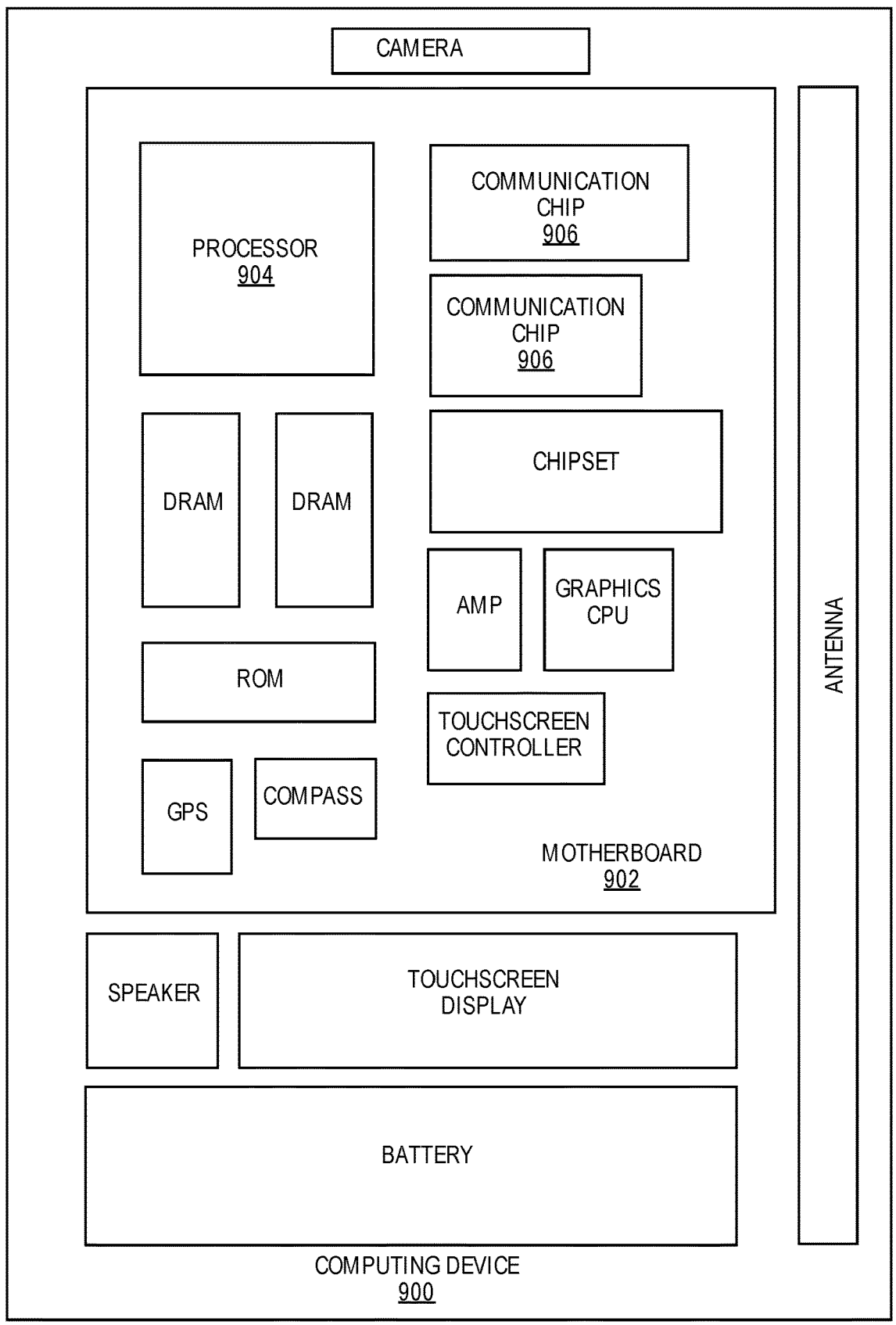
FIG. 9 illustrates a computing device in accordance with one implementation of an embodiment of the invention.

FIG. 9 illustrates a computing device 900 in accordance with one implementation of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (WEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the invention, the integrated circuit die of the processor includes one or more passive devices, such as metal-oxide-polysilicon tunable resistors built in accordance with implementations of the invention. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of the invention, the integrated circuit die of the communication chip includes one or more passive devices, such as metal-oxide-polysilicon tunable resistors built in accordance with implementations of the invention.

In further implementations, another component housed within the computing device 900 may contain an integrated circuit die that includes one or more passive devices, such as metal-oxide-polysilicon tunable resistors built in accordance with implementations of the invention.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 10:
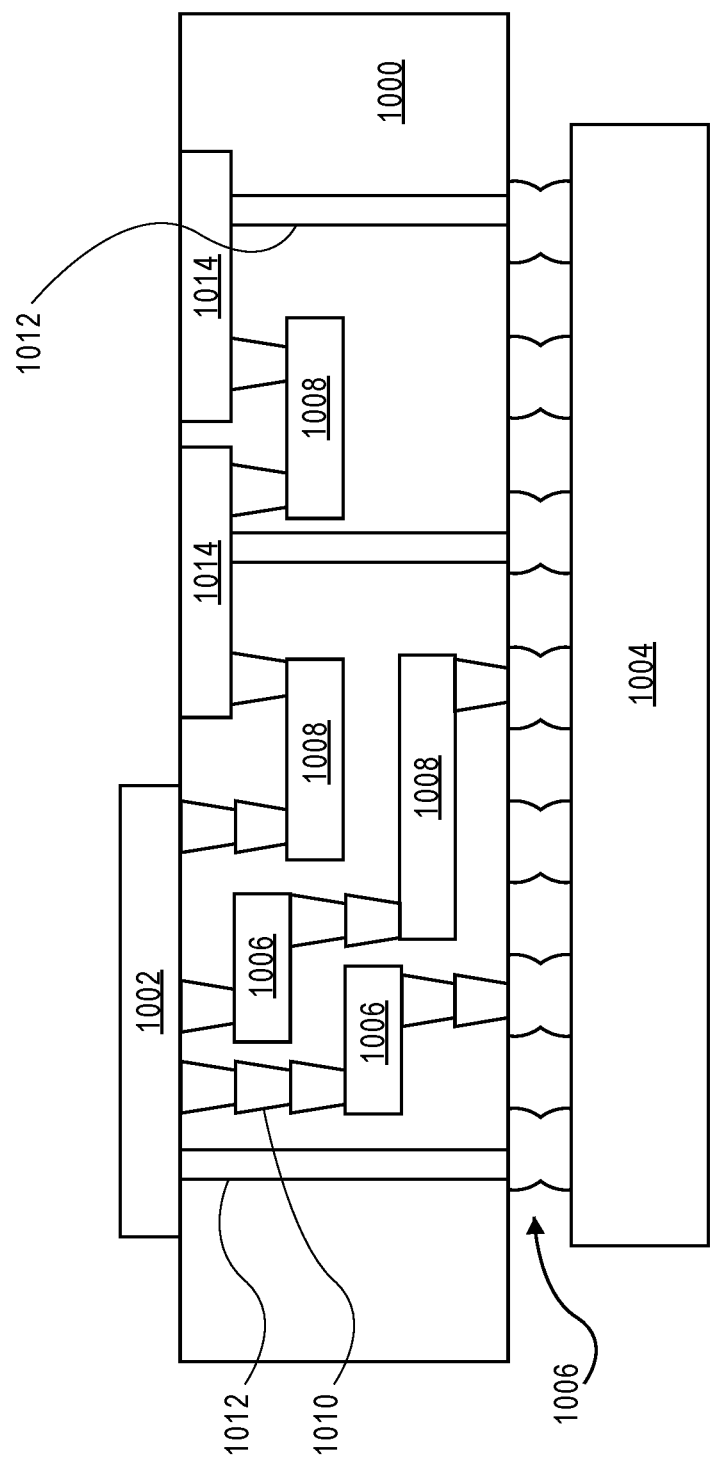
FIG. 10 is an interposer implementing one or more embodiments of the invention.

FIG. 10 illustrates an interposer 1000 that includes one or more embodiments of the invention. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group W materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with embodiments of the invention, apparatuses or processes disclosed herein may be used in the fabrication of interposer 1000.

Thus, embodiments of the present invention include metal-oxide-polysilicon tunable resistors and methods of fabricating metal-oxide-polysilicon tunable resistors.

In an embodiment, a tunable resistor includes a polysilicon resistor structure disposed above a substrate. A gate oxide layer is disposed on the polysilicon resistor structure. A metal gate layer is disposed on the gate oxide layer.

In one embodiment, the gate oxide layer is a high-k dielectric layer.

In one embodiment, the tunable resistor further includes a pair of conductive contacts disposed on the polysilicon resistor structure, on either side of the gate oxide layer and the metal gate layer.

In one embodiment, the tunable resistor further includes a second gate oxide layer disposed on the polysilicon resistor adjacent to but not in contact with the gate oxide layer, and a second metal gate layer disposed on the second gate oxide layer.

In one embodiment, the metal gate layer is for altering a resistance of the polysilicon resistor structure when the metal gate layer is biased, the second metal gate layer is for altering a resistance of the polysilicon resistor structure when the second metal gate layer is biased, and the second metal gate layer can be biased independent from biasing the metal gate layer.

In one embodiment, the tunable resistor further includes a pair of conductive contacts disposed on the polysilicon resistor structure, on either side of the metal gate layer and the second metal gate layer.

In one embodiment, the gate oxide layer and metal gate layer are further disposed on sidewalls of the polysilicon resistor structure.

In one embodiment, the substrate is a bulk single crystalline silicon substrate, and the polysilicon resistor structure is disposed on an isolation region disposed in the bulk single crystalline silicon substrate.

In one embodiment, the polysilicon resistor structure is disposed between and laterally adjacent to, but not on, a semiconductor fin of a semiconductor device formed above the substrate. The semiconductor device includes a metal gate electrode.

In one embodiment, the polysilicon resistor structure is disposed over a semiconductor fin formed above the substrate.

In one embodiment, the tunable resistor further includes a conductive contact disposed on the metal gate layer, the conductive contact electrically connected to the metal gate layer.

In an embodiment, a tunable resistor includes a polysilicon resistor structure disposed above a substrate. The polysilicon resistor has a top surface and a pair of sidewalls. A gate oxide layer disposed on the pair of sidewalls of, but not on the top surface of, the polysilicon resistor structure. A metal gate layer is disposed on the gate oxide layer.

In one embodiment, the gate oxide layer is a high-k dielectric layer.

In one embodiment, the tunable resistor further includes a pair of conductive contacts disposed on the polysilicon resistor structure, on either side of the gate oxide layer and the metal gate layer.

In one embodiment, the tunable resistor of further includes a second gate oxide layer disposed on the pair of sidewalls of, but not on the top surface of, the polysilicon resistor structure and adjacent to but not in contact with the gate oxide layer, and a second metal gate layer disposed on the second gate oxide layer.

In one embodiment, the metal gate layer is for altering a resistance of the polysilicon resistor structure when the metal gate layer is biased, the second metal gate layer is for altering a resistance of the polysilicon resistor structure when the second metal gate layer is biased, and the second metal gate layer can be biased independent from biasing the metal gate layer.

In one embodiment, the tunable resistor further includes a pair of conductive contacts disposed on the polysilicon resistor structure, on either side of the metal gate layer and the second metal gate layer.

In one embodiment, the substrate is a bulk single crystalline silicon substrate, and the polysilicon resistor structure is disposed on an isolation region disposed in the bulk single crystalline silicon substrate.

In one embodiment, the polysilicon resistor structure is disposed between and laterally adjacent to, but not on, a semiconductor fin of a semiconductor device formed above the substrate. The semiconductor device includes a metal gate electrode.

In one embodiment, the polysilicon resistor structure is disposed over a semiconductor fin formed above the substrate.

In one embodiment, the tunable resistor further includes a conductive contact disposed on or adjacent to the metal gate layer, the conductive contact electrically connected to the metal gate layer.

In an embodiment, a method of tuning a resistance of a passive resistor device includes providing a polysilicon resistor element having a first resistance. The method also includes biasing a gate electrode coupled to the polysilicon resistor element to change the first resistance to a second, different, resistance.

In one embodiment, the second resistance is less than the first resistance.

In one embodiment, the second resistance is greater than the first resistance.

In one embodiment, providing the polysilicon resistor element includes providing a polysilicon resistor structure disposed above a substrate, and biasing the gate electrode involves biasing a metal gate layer disposed on a gate oxide layer disposed on a portion of the polysilicon resistor structure.

What is claimed is:

1. A tunable resistor, comprising:
   a polysilicon resistor structure disposed above a substrate, the polysilicon resistor having a first side, a top, and a second side;
   a gate oxide layer disposed on the top of the polysilicon resistor structure but not on the first and second sides of the polysilicon resistor structure; and
   a metal gate layer disposed on the gate oxide layer.

2. The tunable resistor of claim 1, wherein the gate oxide layer is a high-k dielectric layer.

3. The tunable resistor of claim 1, further comprising:
   a pair of conductive contacts disposed on the polysilicon resistor structure, on either side of the gate oxide layer and the metal gate layer.

4. The tunable resistor of claim 1, further comprising:
   a second gate oxide layer disposed on the polysilicon resistor adjacent to but not in contact with the gate oxide layer; and
   a second metal gate layer disposed on the second gate oxide layer.

5. The tunable resistor of claim 4, wherein the metal gate layer is for altering a resistance of the polysilicon resistor structure when the metal gate layer is biased, wherein the second metal gate layer for altering a resistance of the polysilicon resistor structure when the second metal gate layer is biased, and wherein the second metal gate layer can be biased independent from biasing the metal gate layer.

6. The tunable resistor of claim 1, further comprising:
   a pair of conductive contacts disposed on the polysilicon resistor structure, on either side of the metal gate layer and the second metal gate layer.

7. The tunable resistor of claim 1, wherein the substrate is a bulk single crystalline silicon substrate, and the polysilicon resistor structure is disposed on an isolation region disposed in the bulk single crystalline silicon substrate.

8. The tunable resistor of claim 1, wherein the polysilicon resistor structure is disposed between and laterally adjacent to, but not on, a semiconductor fin of a semiconductor device formed above the substrate, and wherein the semiconductor device comprises a metal gate electrode.

9. The tunable resistor of claim 1, wherein the polysilicon resistor structure is disposed over a semiconductor fin formed above the substrate.

10. The tunable resistor of claim 1, further comprising:
    a conductive contact disposed on the metal gate layer, the conductive contact electrically connected to the metal gate layer.

11. A tunable resistor, comprising:
    a polysilicon resistor structure disposed above a substrate, the polysilicon resistor having a top surface and a pair of sidewalls;
    a gate oxide layer disposed on the top surface of the polysilicon resistor but not on the pair of sidewalls of the polysilicon resistor structure; and
    a metal gate layer disposed on the gate oxide layer.

12. The tunable resistor of claim 11, wherein the gate oxide layer is a high-k dielectric layer.

13. The tunable resistor of claim 11, further comprising:
    a pair of conductive contacts disposed on the polysilicon resistor structure, on either side of the gate oxide layer and the metal gate layer.

14. The tunable resistor of claim 11, further comprising:
    a second gate oxide layer adjacent to but not in contact with the gate oxide layer; and
    a second metal gate layer disposed on the second gate oxide layer.

15. The tunable resistor of claim 14, wherein the metal gate layer is for altering a resistance of the polysilicon resistor structure when the metal gate layer is biased, wherein the second metal gate layer for altering a resistance of the polysilicon resistor structure when the second metal gate layer is biased, and wherein the second metal gate layer can be biased independent from biasing the metal gate layer.

16. The tunable resistor of claim 11, further comprising:
    a pair of conductive contacts disposed on the polysilicon resistor structure, on either side of the metal gate layer and the second metal gate layer.

17. The tunable resistor of claim 11, wherein the substrate is a bulk single crystalline silicon substrate, and the polysilicon resistor structure is disposed on an isolation region disposed in the bulk single crystalline silicon substrate.

18. The tunable resistor of claim 11, wherein the polysilicon resistor structure is disposed between and laterally adjacent to, but not on, a semiconductor fin of a semiconductor device formed above the substrate, and wherein the semiconductor device comprises a metal gate electrode.

19. The tunable resistor of claim 11, wherein the polysilicon resistor structure is disposed over a semiconductor fin formed above the substrate.

20. The tunable resistor of claim 11, further comprising:
a conductive contact disposed on or adjacent to the metal gate layer, the conductive contact electrically connected to the metal gate layer.

21. A tunable resistor, comprising:
a polysilicon resistor structure disposed above a substrate;
a gate oxide layer disposed on the polysilicon resistor structure; and
a metal gate layer disposed on the gate oxide layer;
a second gate oxide layer disposed on the polysilicon resistor adjacent to but not in contact with the gate oxide layer; and
a second metal gate layer disposed on the second gate oxide layer, the metal gate layer is for altering a resistance of the polysilicon resistor structure when the metal gate layer is biased, wherein the second metal gate layer for altering a resistance of the polysilicon resistor structure when the second metal gate layer is biased, and wherein the second metal gate layer can be biased independent from biasing the metal gate layer.

22. A tunable resistor, comprising:
a polysilicon resistor structure disposed above a substrate, the polysilicon resistor having a top surface and a pair of sidewalls;
a gate oxide layer disposed on the pair of sidewalls of, but not on the top surface of, the polysilicon resistor structure; and
a metal gate layer disposed on the gate oxide layer;
a second gate oxide layer disposed on the pair of sidewalls of, but not on the top surface of, the polysilicon resistor structure and adjacent to but not in contact with the gate oxide layer; and
a second metal gate layer disposed on the second gate oxide layer, wherein the metal gate layer is for altering a resistance of the polysilicon resistor structure when the metal gate layer is biased, wherein the second metal gate layer for altering a resistance of the polysilicon resistor structure when the second metal gate layer is biased, and wherein the second metal gate layer can be biased independent from biasing the metal gate layer.

\* \* \* \* \*